United States Patent
Deguchi et al.

(10) Patent No.: US 9,245,621 B2
(45) Date of Patent: Jan. 26, 2016

(54) SEMICONDUCTOR MEMORY DEVICE EXECUTING A WRITE OPERATION WITH FIRST AND SECOND VOLTAGE APPLICATIONS

(75) Inventors: Jun Deguchi, Kawasaki (JP); Haruki Toda, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 115 days.

(21) Appl. No.: 14/118,703

(22) PCT Filed: Mar. 9, 2012

(86) PCT No.: PCT/JP2012/056788
§ 371 (c)(1),
(2), (4) Date: Nov. 19, 2013

(87) PCT Pub. No.: WO2012/160863
PCT Pub. Date: Nov. 29, 2012

(65) Prior Publication Data
US 2014/0104930 A1  Apr. 17, 2014

(30) Foreign Application Priority Data
May 26, 2011  (JP) ................. 2011-117555

(51) Int. Cl.
*G11C 11/00* (2006.01)
*G11C 13/00* (2006.01)

(52) U.S. Cl.
CPC ........ *G11C 13/0069* (2013.01); *G11C 13/0002* (2013.01); *G11C 13/0007* (2013.01);
(Continued)

(58) Field of Classification Search
CPC ........... G11C 13/0069; G11C 13/0004; G11C 13/0007

USPC ....................... 365/148, 230.06, 51
See application file for complete search history.

(56) References Cited

U.S. PATENT DOCUMENTS 6,980,465 B2  12/2005  Taussig et al.
7,236,389 B2  6/2007  Hsu
(Continued)

FOREIGN PATENT DOCUMENTS

CN  101150130 A  3/2008
JP  2010 33675  2/2010
(Continued)

OTHER PUBLICATIONS

Taiwanese Office Action issued Jul. 29, 2014, in Taiwan Patent Application No. 101108720 (with English translation).
(Continued)

*Primary Examiner* — Connie Yoha
(74) *Attorney, Agent, or Firm* — Oblon, McClelland, Maier & Neustadt, L.L.P.

(57) ABSTRACT

A semiconductor memory device comprises a memory cell array including plural memory cells provided at the intersections of plural first lines and plural second lines; and a write circuit. The write circuit, on execution of a write operation, executes a first step of applying a voltage across the first and second lines connected to a data-write-targeted, selected memory cell, and a different voltage across the first and second lines connected to a data-write-untargeted, unselected memory cell of the plural memory cells and, after execution of the first step, executes a second step of applying a voltage, required for data write, across the first and second lines connected to the selected memory cell, and bringing at least one of the first and second lines connected to the unselected memory cell into the floating state.

20 Claims, 7 Drawing Sheets

(52) U.S. Cl.
CPC .. *G11C2013/009* (2013.01); *G11C 2013/0073* (2013.01); *G11C 2013/0085* (2013.01); *G11C 2013/0088* (2013.01); *G11C 2213/71* (2013.01); *G11C 2213/77* (2013.01)

(56) References Cited

U.S. PATENT DOCUMENTS

| | | | |
|---|---|---|---|
| 7,889,538 | B2 | 2/2011 | Toda |
| 7,940,554 | B2 | 5/2011 | Scheuerlein et al. |
| 7,983,065 | B2 | 7/2011 | Samachisa |
| 8,004,873 | B2 | 8/2011 | Toda |
| 8,023,313 | B2 | 9/2011 | Toda |
| 8,094,477 | B2 | 1/2012 | Maejima |
| 8,537,595 | B2 | 9/2013 | Toda |
| 8,947,909 | B1 * | 2/2015 | Sutardja et al. ............... 365/148 |
| 2004/0257864 | A1 | 12/2004 | Tamai et al. |
| 2007/0041235 | A1 | 2/2007 | Inoue |
| 2008/0025066 | A1 * | 1/2008 | Fasoli et al. ................... 365/148 |
| 2010/0027308 | A1 | 2/2010 | Maejima |
| 2010/0054019 | A1 | 3/2010 | Toda |
| 2010/0080037 | A1 * | 4/2010 | Inoue et al. ................... 365/148 |
| 2010/0162068 | A1 | 6/2010 | Toda |
| 2010/0208510 | A1 | 8/2010 | Hosono et al. |
| 2011/0116300 | A1 | 5/2011 | Maejima |
| 2011/0140070 | A1 | 6/2011 | Kim |
| 2013/0223126 | A1 * | 8/2013 | Kwak et al. ................... 365/148 |

FOREIGN PATENT DOCUMENTS

| | | |
|---|---|---|
| JP | 2010-192040 | 9/2010 |
| TW | 201106361 A1 | 2/2011 |
| TW | 201106370 A1 | 2/2011 |

OTHER PUBLICATIONS

Extended European Search Report issued Oct. 15, 2014, in European Patent Application No. 12790300.3.

International Search Report Issued Jun. 19, 2012 in PCT/JP12/056788 Filed Mar. 9, 2012.

Written Opinion of the International Searching Authority Issued Jun. 19, 2012 in PCT/JP12/056788 Filed Mar. 9, 2012.

U.S. Appl. No. 14/005,149, filed Sep. 13, 2013, Toda.

Office Action issued on Jan. 21, 2014 in the corresponding Japanese Application No. 2011-117555 (with English Translation).

Notice Concerning Filing of Arguments issued Jul. 16, 2015 in Korean Patent Application No. 10-2013-7033816 (with English language translation).

Combined Office Action and Search Report issued May 5, 2015 in Chinese Patent Application No. 201280025590.2 (with English language translation and English Translation of Category of Cited Documents).

* cited by examiner

SEMICONDUCTOR MEMORY DEVICE EXECUTING A WRITE OPERATION WITH FIRST AND SECOND VOLTAGE APPLICATIONS

CROSS-REFERENCE TO RELATED APPLICATIONS

This application is based upon and claims the benefit of priority from the prior Japanese Patent Application No. 2011-117555, filed on May 26, 2011, the entire contents of which are incorporated herein by reference.

FIELD

The embodiment relates to a semiconductor memory device.

BACKGROUND

A variable resistance memory (ReRAM: Resistance Random Access Memory) easily formable in three dimensions, for example, has received attention as a semiconductor memory device capable of storing mass data for use. Cells of the variable resistance memory are characterized in the asymmetry of the voltage-current characteristic that greatly changes in accordance with the polarity of the voltage applied to the memory cell.

Conventionally, the semiconductor memory device including the variable resistance memory cells distinguishes a selection-targeted memory cell (hereinafter referred to as a "selected memory cell") from other memory cells (hereinafter referred to as "unselected memory cells") by applying a bias, different from that to the selected memory cell, to all unselected memory cells from external to make access to the selected memory cell. In accordance with setting of the bias, it is possible to increase the margin of failed operation of unselected memory cells, thereby ensuring reliable operation of the cell array. The setting of the bias is not easy, however, and if it is intended to make access under an optimal bias condition, an increase occurs in current consumption, for example, as a problem.

Therefore, if these variable resistance memories are used in mass storage semiconductor memory devices, the size of the access-targeted cell array cannot be increased sufficiently. As a result, the share of memory cells in a semiconductor memory device lowers such that the merit of the three-dimensional structure cannot be exerted sufficiently.

[Patent Document 1] JP 2010-33675A

DETAILED DESCRIPTION

A semiconductor memory device according to the embodiment comprises a memory cell array including plural first lines, plural second lines intersecting the first lines, and plural memory cells provided at the intersections of the plural first lines and the plural second lines and operative to store data in accordance with different resistance states; and a write circuit operative to execute a write operation to a data-write-targeted, selected memory cell of the plural memory cells, the memory cell having a set operation for changing the resistance state from the first resistance state to the second resistance state on application of a set voltage of the first polarity, and a reset operation, for changing the resistance state from the second resistance state to the first resistance state on application of a reset voltage of the second polarity opposite in polarity to the first polarity, and having the voltage-current characteristic at the first polarity and the voltage-current characteristic at the second polarity being asymmetrical, and the write circuit, on execution of the write operation, executing a first step of applying a Voltage across the first and second lines connected to the selected memory cell, and a different voltage across the first and second lines connected to a data-write-untargeted, unselected memory cell of the plural memory cells and, after execution of the first step, executing a second step of applying a voltage, required for data write, across the first and second lines connected to the selected memory cell, and bringing at least one of the first and second lines connected to the unselected memory cell into the floating state.

Semiconductor memory devices according to the embodiments will now be described below with reference to the drawings.

[First Embodiment]

Figure 1:
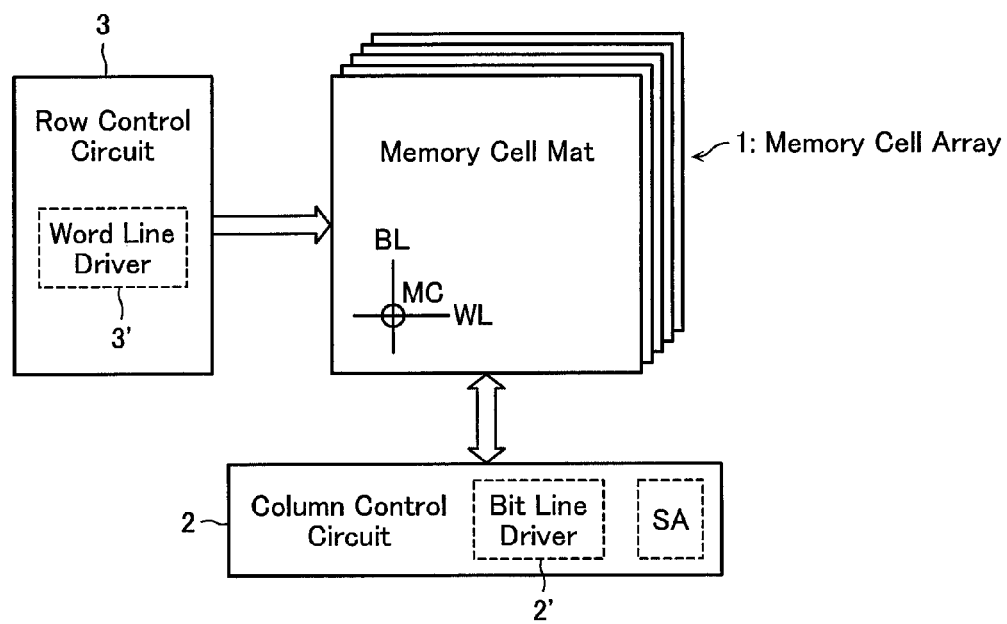
[FIG. 1] A diagram showing the configuration of a semiconductor memory device according to a first embodiment.

FIG. 1 is a diagram showing the configuration of a semiconductor memory device according to a first embodiment.

This semiconductor memory device comprises a memory cell array 1. The memory cell array 1 includes plural stacked memory cell mats (memory cell layers). Each memory cell mat contains plural bit lines BL (first lines) and plural word lines WL (second lines), and memory cells MC selected by these word lines WL and bit lines BL. Hereinafter, the bit lines BL and word lines WL may also be referred to as "lines" generally. In the present embodiment, it is not always required to include plural stacked memory cell mats.

The bit lines BL in the memory cell mat are electrically connected to a column control circuit 2 operative to control the bit lines BL and execute erasing data in the memory cell MC, writing data in the memory cell MC and reading data from the memory cell MC. Hereinafter, erasing data in the memory cell MC and writing data in the memory cell MC may also be referred to as "write operation" collectively. In addition, the write operation and reading data from the memory cell MC may also be referred to as "access operation" collectively. The column control circuit 2 includes a bit line driver 2' operative to supply a voltage, required for access operation, to the bit line BL, and a sense amp SA operative to sense and amplify the current flowing in the memory cell MC at the time of read operation to determine the data stored in the memory cell MC.

On the other hand, the word lines WL in th,e memory cell mat are electrically connected to a row control circuit 3 operative to select among the word lines WL at the time of access operation. The row control circuit 3 includes a word line driver 3' operative to supply a voltage, required for access operation, to the word line WL. The row control circuit 3, together with the column control circuit 2, is contained in a write circuit.

Figure 2:
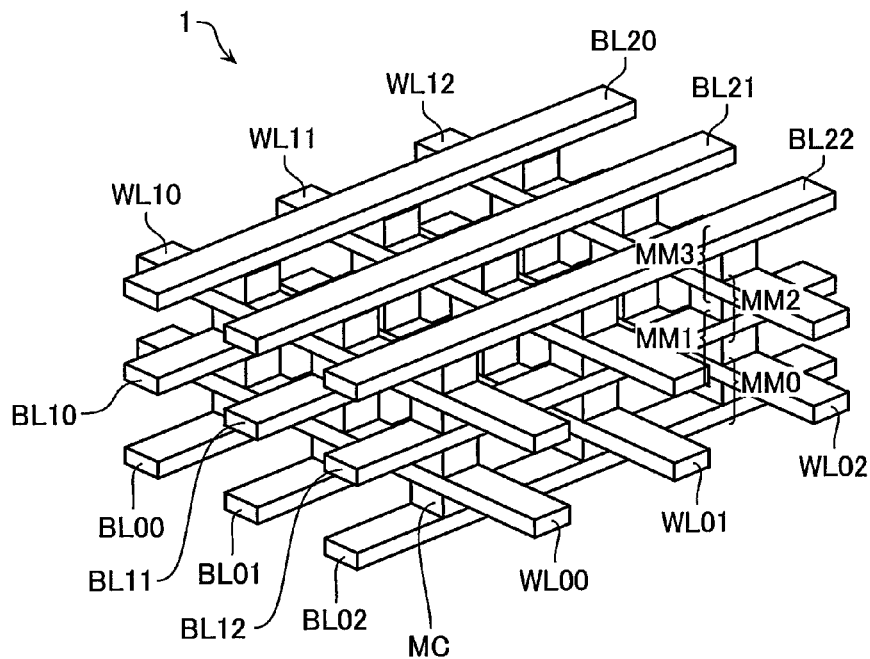
[FIG. 2] A perspective view of part of a memory cell array in the semiconductor memory device according to the same embodiment.

FIG. 2 is a perspective view showing part of the memory cell array 1.

The memory cell array 1 is a memory cell array of the cross-point type. The memory cell mat MM in the memory cell array 1 includes plural bit lines BL disposed in parallel, and plural word lines WL disposed in parallel in the direction of intersecting the bit lines BL. Each intersection of the bit line BL and the word line WL is provided with a memory cell MC as sandwiched between both lines. The memory cell array 1 includes plural such memory cell mats MM stacked in multiple layers, as described above, in which the vertically adjacent memory cell mats MM share the word lines WL or the bit lines BL. In the case of FIG. 2, a memory cell mat MM0 in the lowermost layer of the memory cell array 1 and a memory cell mat MM1 adjacently located above the memory cell mat MM0 share the word lines WL00-WL02.

Figure 3:
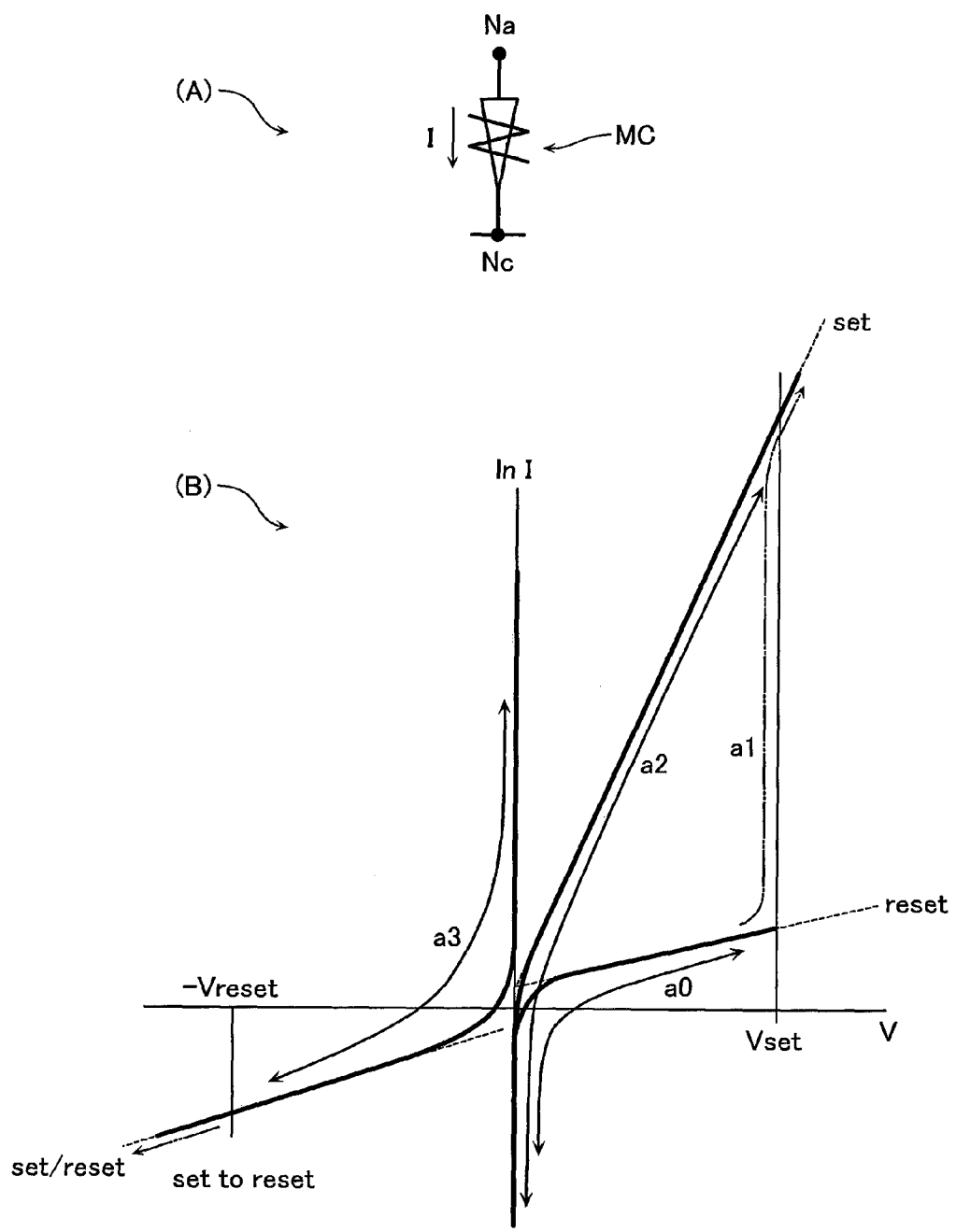
[FIG. 3] A diagram showing a circuit symbol and a voltage-current characteristic of a memory cell in the semiconductor memory device according to the same embodiment.

FIG. 3(A) is a diagram showing a circuit symbol of the memory cell MC. FIG. 3(B) is a diagram showing a voltage-current characteristic of the memory cell MC. Hereinafter, a node Na shown in FIG. 3(A) is referred to as the "anode", and a node Nc as the "cathode". The direction facing from the anode Na toward the cathode Nc shown by the arrow in FIG. 3(A) is referred to as the "forward direction", and the direction in reverse thereto as the "reverse direction. Therefore, a bias is the forward bias (first polarity) if the voltage on the cathode Nc is lower than that on the anode Na while a bias is the reverse bias (second polarity) if the voltage on the cathode Nc is higher than that on the anode Na.

The memory cell MC comprises a variable resistance element and stores data in accordance with different resistance states of the variable resistance element. Hereinafter, a state of the memory cell MC including the variable resistance element in the high resistance state (first resistance state) is referred to as a "reset state" while a state of the memory cell MC including the variable resistance element in the low resistance state (second resistance state) is referred to as a "set state". In addition, the operation for changing the memory cell MC in the reset state into the set state is referred to as "set operation" while the operation for changing the memory cell MC in the set state into the reset state is referred to as "reset operation". Therefore, the write operation is referred to as that for subjecting the memory cell MC to set operation or reset operation.

The memory cell MC has the property of a solid electrolyte. This is the property that makes the voltage-current characteristic asymmetrical in accordance with the direction of a bias (the polarity of an applied voltage) as shown in FIG. 3(B). As can be found from FIG. 3(B), the voltage-current characteristic of the memory cell MC is such that the cell current can be approximated by $I \sim A \exp(\alpha V)$ (A and $\alpha$ are constants) except the vicinity of the applied voltage V=0. The coefficient $\alpha$ when the memory cell MC in the reset state is forward-biased is almost the same as that when the memory cell MC in the reset state is reverse-biased and that when the memory cell MC in the set state is reverse-biased. In contrast, the coefficient $\alpha$ when the memory cell MC in the set state is forward-biased becomes extremely large. Further, ln I becomes $\pm\infty$ in the vicinity of the applied voltage V=0.

When the memory cell MC in the reset state is forward-biased, the memory cell MC still remains in the reset state within a range of the applied voltages V from near 0V to a set voltage Vset. In this case, the cell current I flowing in the memory cell MC varies reversibly in accordance with variations in the applied voltage V (the arrow a0). When the applied voltage V becomes equal to or higher than the set voltage Vset, the state of the memory cell MC changes from the reset state to the set state irreversibly (set operation) (the arrow a1).

When the memory cell MC in the set state is forward-biased, on the other hand, the cell current I flowing in the memory cell MC varies reversibly in accordance with variations in the applied voltage V (the arrow a2). The memory cell MC in the set state, however, can make no transition to the reset state as far as it is forward-biased even if the applied-voltage V is elevated.

When the memory cell MC in the reset state is reverse-biased, the cell current I flowing in the memory cell MC varies reversibly in accordance with variations in the applied voltage V (the arrow a3). The memory cell MC in the reset state, however, can make no transition to the set state as far as it is reverse-biased even if the applied voltage V is elevated.

When the memory cell MC in the set state is reverse-biased, on the other hand, the memory cell MC still remains in the set state within a range of the applied voltages from 0V, the reverse bias from 0V, to a voltage, −Vreset (hereinafter, Vreset is referred to as a "reset voltage"). In this case, the cell current I flowing in the memory cell MC varies reversibly in accordance with variations in the, applied voltage V (the arrow a3). When the applied voltage V becomes equal to or lower than the voltage, −Vreset, the state of the memory cell MC changes from the set state to the reset state irreversibly (reset operation).

Figure 4:
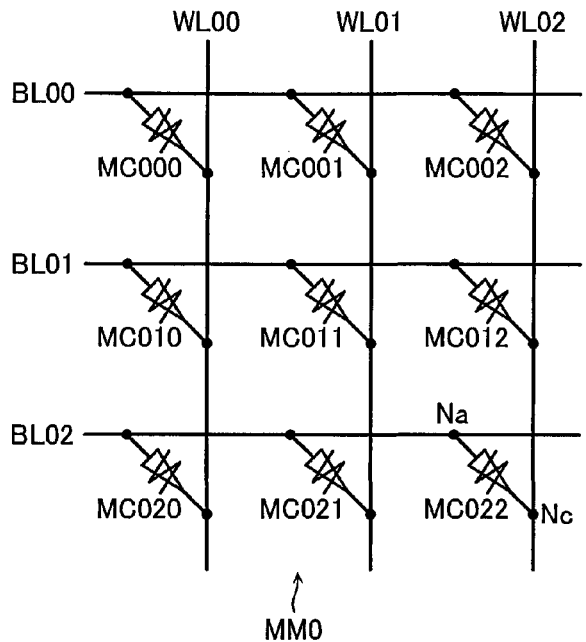
[FIG. 4] An equivalent circuit diagram of part of the memory cell array in the semiconductor memory device according to the same embodiment.

FIG. 4 is an equivalent circuit diagram of part of the memory cell array 1. This figure shows bit lines BL0-BL2, word lines WL00-WL02, and plural memory cells MC in the memory cell mat MM0 as part of the memory cell array 1.

In the case of FIG. 4, the bit line BL is connected to the anode Na, and the word line WL to the cathode Nc.

Referring to the equivalent circuit of FIG. 4, the write operation to the memory cell MC is described next. For convenience of description, an access-targeted memory cell may also be referred to a "selected memory cell", other memory cells as "unselected memory cells", a bit line connected to the selected memory cell as a "selected bit line", a word line connected to the selected memory cell as a "selected word line", a bit line connected to an unselected memory cell as an "unselected bit line", and a word line connected to an unselected memory cell as an "unselected word line". The selected bit line and the selected word line may also be referred to as "selected lines" generally, and unselected bit lines and unselected word lines as "unselected lines" generally.

The following description is given to the case when all memory cells MC are in the reset state in which a memory cell MC001 in a memory cell mat MM0 is determined as a selected memory cell, and the selected memory cell MC001 is subject to set operation.

When the selected memory cell MC001 is subject to the set operation, the selected bit line BL00 connected to the selected memory cell MC001 is applied with a set voltage Vset, and the selected word line WL01 connected to the selected memory cell MC001 is applied with 0V. At that time, an idea is required to prevent data disturb in other unselected memory cells MC such as memory cells MC000, MC002.

As one such method, there is a method of applying a voltage Vset/2 equal to half the set voltage Vset across unselected bit lines BL01 and BL02 and unselected word lines WL00 and WL02.

In this case, unselected memory cells MC010, MC012, MC020 and MC022 connected to the intersections of the unselected bit lines BL01 and BL02 and the unselected word lines WL00 and WL0 are not biased. Unselected memory cells MC000 and MC002 connected to the selected bit line BL00 and unselected memory cells MC011 and MC021 connected to the selected word line WL01 are applied with a forward bias of the voltage Vset/2. Nevertheless, the voltage Vset/2 is not a sufficient forward bias capable of causing set operation as can be found from the characteristic of the memory cell MC shown in FIG. 3(B).

Thus, the above method is possible to subject the selected memory cell MC001 to the set operation without causing data disturb in unselected memory cells MC.

The use of this method, however, causes a plurality of unselected memory cells forward-biased between fixed potentials and accordingly increases current consumption, for example, as a problem. Therefore, the use of the memory cells as a large-capacity memory file, for example, requires dealing while suppressing the range of memory cells related to the write operation as narrow as possible. As a result, the share of memory cells in the entire device lowers such that it is not possible to sufficiently exert the characteristic of the memory cell of the cross-point type easily formable in three-dimensions.

As a method of solving the above problem, there is a write operation through a floating access method.

Figure 12:
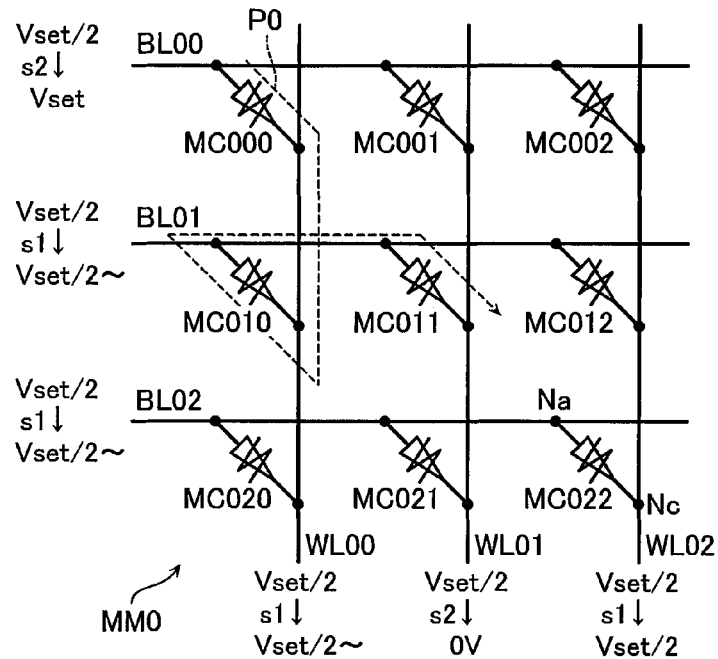
[FIG. 12] A diagram showing a bias state of a memory cell array at the time of write operation (set operation) through a floating access method in a semiconductor memory device according to a comparison example.

FIG. 12 is a diagram showing a bias state of a memory cell array at the time of write operation (set operation) through the floating access method, providing a comparison example to the present embodiment. In FIG. 12, "~" indicates that it is in the floating state. For example, "Vset/2~" means that it is brought into the floating state while applied with the voltage Vset/2.

The floating access method is a method of applying the set voltage or the reset voltage to the selected memory cell while bringing at least one of bit lines and word lines connected to unselected memory cells into the floating state. It is a method of placing unselected memory cells into bias states distributed in a self-aligned manner.

The following description is given to the case when all memory cells MC are in the reset state, as a specific example, in which a memory cell MC001 in a memory cell mat MM0 is determined as a selected memory cell, and the selected memory cell MC001 is subject to a set operation.

The write operation through the floating access method can be realized by two steps, including an access preparation step (first step) of turning the state of retaining the resistance state of the memory cell MC (hereinafter referred to as a "standby state") to the state of making the memory cell MC accessible (hereinafter referred to as an "active standby state"), and an access step (second step) of actually making access to the memory cell MC in the memory cell array in the active standby state. The state of the memory cell array at the access step is referred to as an "access state".

Before the set operation, the memory cell array 1 is in the standby state. In this state, the bit line driver and the word line driver (not shown) apply a voltage equal to around the ground voltage (0V) to all bit lines BL00-BL02 and word lines WL00-WL02.

Subsequently, at the access preparation step, as shown in FIG. 12, the bit line driver and the word line driver apply a voltage Vset/2 equal to half the set voltage Vset to all bit lines BL00-BL02 and word lines WL00-WL02.

Then, at the access step, as shown in FIG. 12, after bringing unselected bit lines BL01 and BL02 and unselected word lines WL00 and WL02 into the floating state (Vset/2~) (s1 in FIG. 12), the bit line driver and the word line driver apply the set voltage Vset to the selected bit line BL00, and 0V to the selected word line WL01 (s2 in FIG. 12).

At the access step, the selected memory cell MC001 is applied with a forward bias of the set voltage Vset. On the other hand, unselected memory cells MC are applied with some bias through current paths extending from the selected bit line BL00 toward the selected word line WL00.

The current paths passing through unselected memory cells MC pass through at least three unselected memory cells MC. For example, in the case of a current path P0 shown with the dashed-line in FIG. 12, it passes from the selected bit line BL00 toward the selected word line WL01 through three unselected memory cells MC000, MC010 and MC011.

In a word, in the current path passing through unselected memory cells, the set voltage Vset is divided by at least three unselected memory cells MC. As a result, an unselected memory cell MC is only applied with a voltage that is determined in accordance with the location thereof in a self-aligned manner and that is lower than the set voltage Vset.

The current path passing through unselected memory cells MC always involves a reverse-biased, unselected memory cell MC such as the unselected memory cell MC010 in the current path P0. Therefore, an extremely slight current is allowed to flow therein. As a result, it is possible to suppress power consumption in the memory cell array.

Further, the write operation through the floating access method is just required at the access step to bring unselected lines into the floating state. Accordingly, it can be realized with no requirement of special peripheral circuits and no increase in chip area.

Figure 13:
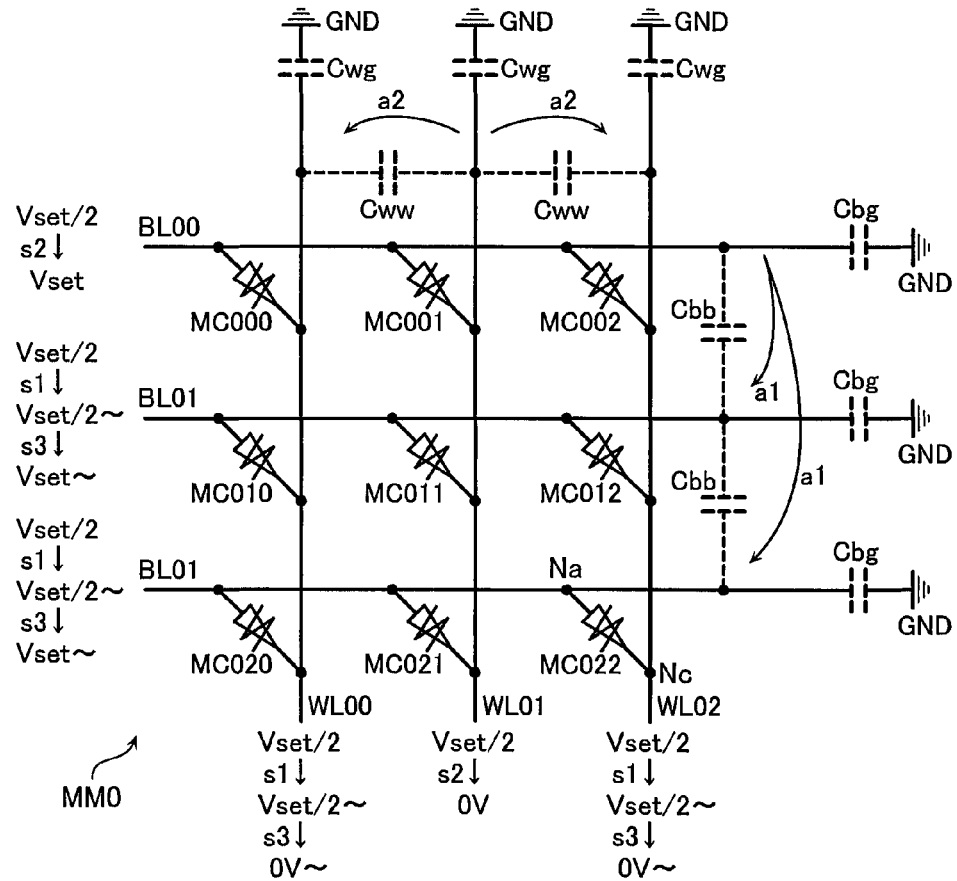
[FIG. 13] A diagram showing a bias state of the memory cell array in consideration of the capacitive coupling between lines in FIG. 12.

The above-described write operation according to the comparison example assumes a memory cell array having an ideal characteristic. In practice, the fine processing of the memory cell array, for example, in the memory cell array, may cause, as shown with the dashed-line in FIG. 13, parasitic capacities Cbb, Cww, Cbg and Cwg between the bit lines BL, between the word lines WL, between the bit line BL and the ground line GND, and between the word line WL and the ground line GND, respectively. Therefore, the write operation according to the comparison example causes the following problem.

When the memory cell array is finely processed, in comparison with the distance between the bit line BL and the ground line GND or between the word line WL and the ground line GND, the distance between the bit lines BL or between the word lines WL becomes extremely shorter. Therefore, the above parasitic capacities are related as in Cbb>>Cbg, Cww>>Cwg.

Therefore, in practice, when the unselected bit lines BL01 and BL02 are brought into the floating state (s1 in FIG. 13), and then the potential on the selected bit line BL00 is changed from the voltage Vset/2 to the set voltage. Vset (s2 in FIG. 13), the capacitive coupling through the parasitic capacity Cbb boosts the voltages on the unselected bit lines BL01 and BL02 (a1, s3 in FIG. 11). For example, if the capacitive coupling between the bit lines BL has a coupling coefficient of 1, the potentials on the unselected bit lines BL01 and BL02 in the floating state rise from near the voltage Vset/2 to near the set voltage Vset by the voltage Vset/2.

This is similar to the case of the word lines WL. For example, if the capacitive coupling between the word lines WL has a coupling coefficient of 1, the potentials on unselected word lines WL fall from near the voltage Vset/2 to near 0V by the voltage Vset/2 (s3 in FIG. 13).

As a result, unselected memory cells MC are applied with a forward bias of the set voltage Vset as well. Furthermore, data disturb in unselected memory cells MC arise.

In the case of the memory cell MC subjected to reset operation, though the detailed description thereof is omitted, the influence of the capacitive coupling between lines may possibly cause data disturb as is the case with the above set operation.

Therefore, in order to suppress data disturb due to the influence of the capacitive coupling, the present embodiment uses the write operation through the floating access method capable of ensuring a sufficient disturb margin at the access step.

Figure 5:
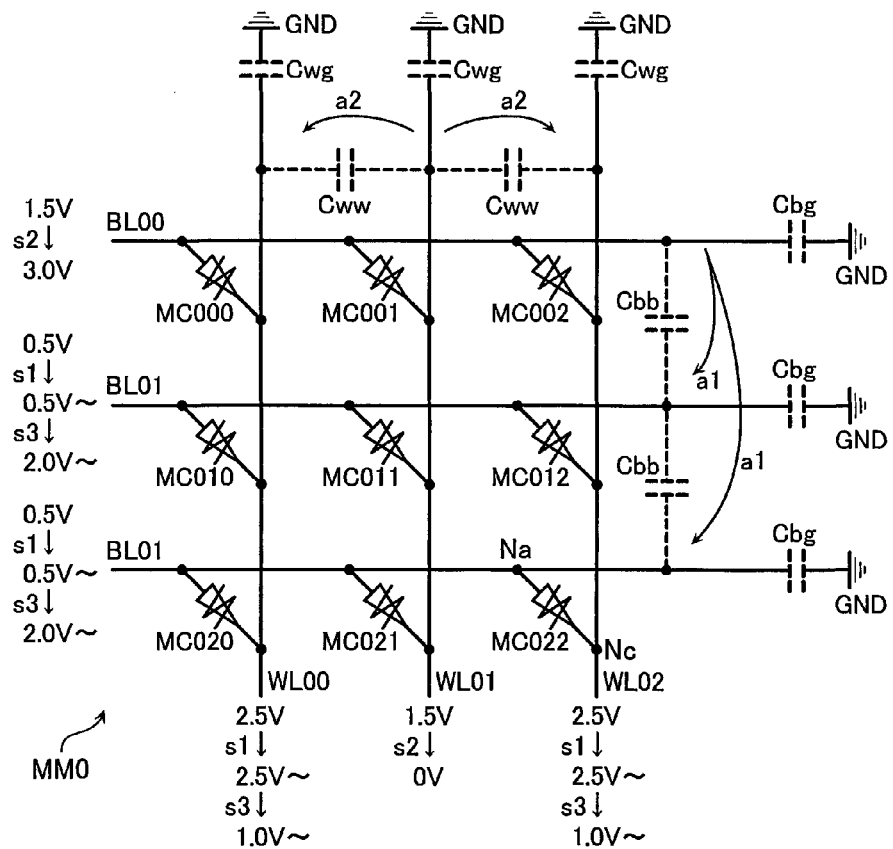
[FIG. 5] A diagram showing a bias state of the memory cell array at the time of write operation (set operation) through a floating access method in the semiconductor memory device according to the same embodiment.

FIG. 5 is a diagram showing a bias state of the memory cell array 1 at the time of write operation (set operation) through the floating access method according to the present embodiment. The indications in the figure follow FIG. 13.

Figure 6:
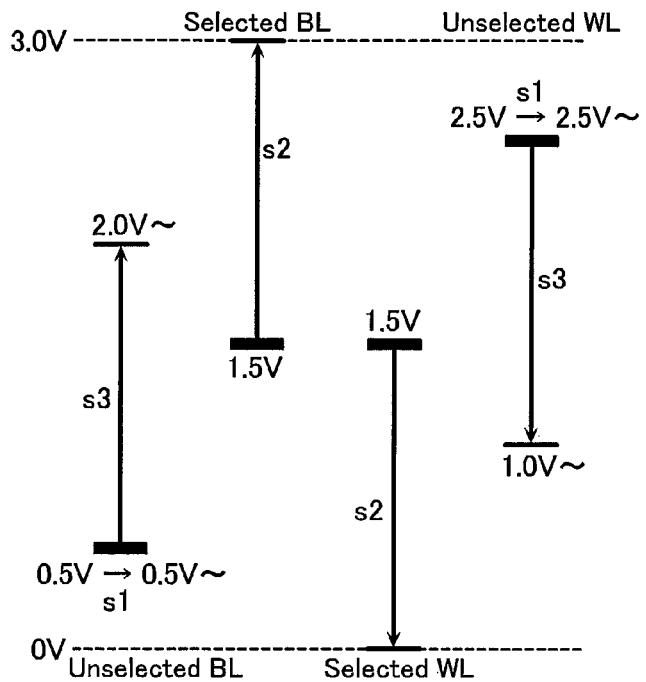
[FIG. 6] A diagram showing a specific potential variation on each line at the time of write operation (set operation) through the floating access method in the semiconductor memory device according to the same embodiment.

FIG. 6 is a diagram showing a potential variation on each line at the time of set operation according to the present embodiment. In the figure, the potential shown with the bold solid line is a potential at the time of completion of the access preparation step, and the potential shown with the thin solid line indicates a potential after application of the set voltage to the selected bit line. The thin solid line indicates a potential when the capacitive coupling between lines has a coupling coefficient of 1.

A specific example is described here on the case when all memory cells MC are in the reset state, and a memory cell MC001 in a memory cell mat MM0 is determined as a selected memory. In this case, the selected memory cell MC001 is subject to set operation.

For easy understanding, the description is given indicating specific numerals. For example, the set voltage Vset is 3.0 V and the capacitive coupling between bit lines BL and that between word lines WL have a coupling coefficient of 1. The present embodiment is though not limited to these indicated numerals as described later. This point should be noted.

As described below, the set operation according to the present embodiment differs from the set operation according to the comparison example in the bias state of the memory cell array 1 at the access preparation step.

As for the standby state before the set operation, it is similar to that in the case of the comparison example and accordingly omitted from the description.

Subsequently, at the access preparation step, as shown in FIG. 5, the bit line driver 2' applies 1.5 V to the selected bit line BL00, and 0.5 V to unselected bit lines BL01 and BL02 In addition, the word line driver 3' applies 1.5 V to the selected word line WL01, and 2.5 V to unselected word lines WL00 and WL02.

At the access step, as shown in FIG. 5, after bringing unselected bit lines BL01 and BL02 and unselected word lines WL00 and WL02 into the floating state (0.5 V~ and 2.5 V~) (S1 in FIG. 5), the bit line driver 2' applies 3.0 V to the selected bit line BL00, and the word line driver 3' applies 0 V to the selected word line WL01 (s2 in FIG. 5).

At the access step, the selected memory cell MC001 is applied with a forward bias of the set voltage Vset, that is, 3.0 V.

When the potential on the selected bit line BL00 is changed from 1.5 V to 3.0 V (s2 in FIGS. 5 and 6), on the other hand, the capacitive coupling through the parasitic capacity Cbb boosts the potentials on unselected bit lines BL01 and BL02 (a1 in FIG. 5, s3 in FIGS. 5 and 6). Specifically, the potentials on the unselected bit lines BL01 and BL02 in the floating state rise from near 0.5 V to near 2.0 V by 1.5 V.

This is similar to the case of the word lines WL. When the potential on the selected word line WL01 is changed from 1.5 V to 0 V (s2 in FIGS. 5 and 6), the potentials on the unselected word lines WL00 and WL02 fall via the parasitic capacity Cww (a2 in FIG. 5, s3 in FIGS. 5 and 6). Specifically, the potentials on the unselected word lines WL00 and WL02 in the floating state fall from near 2.5 V to near 1.0 V by 1.5 V.

In the case of the present embodiment, however, different from the case of the comparison example, every unselected memory cell MC is only applied with a forward bias lower than 3.0 V that cannot reach the set voltage Vset. Specifically, unselected memory cells MC00 and MC02 connected to the selected bit line BL00 are only applied with a forward bias of 2.0 V and other unselected memory cells with 1.0 V. In a word, the set operation according to the present embodiment is possible to ensure a disturb margin of 1.0 V at the minimum even if it is assumed that the capacitive coupling between lines has a coupling coefficient of 1 as the worst condition.

Figure 7:
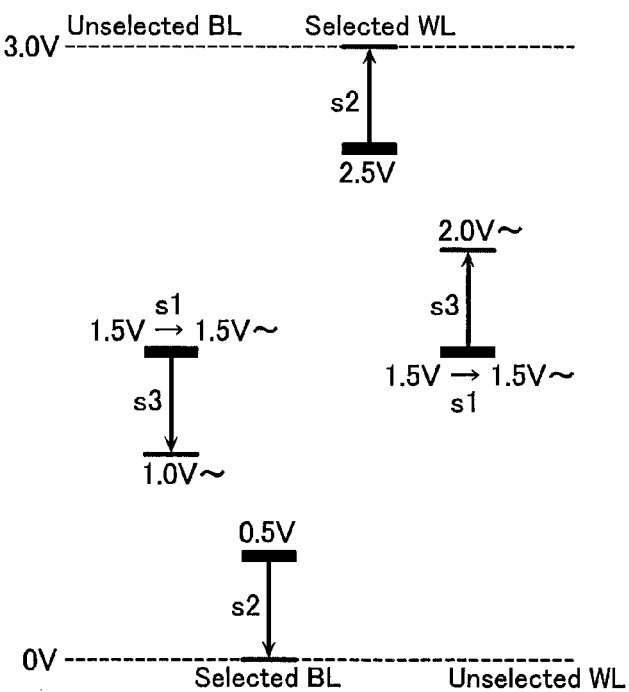
[FIG. 7] A diagram showing a specific potential variation on each line at the time of write operation (reset operation) through the floating access method in the semiconductor memory device according to the same embodiment.

FIG. 7 is a diagram showing a potential variation on each line at the time of write operation (reset operation) through the floating access method according to the present embodiment. The indications in the figure follow FIG. 6. As for the diagram showing a bias state of the memory cell array 1 at the time of the reset operation according to the present embodiment, it is similar to FIG. 5 except specific numerals and accordingly omitted.

For easy understanding, the following description is given indicating specific numerals. For example, the reset voltage Vreset is 3.0 V and the capacitive coupling between bit lines BL and that between word lines WL have a coupling coefficient of 1. The present embodiment is though not limited to these indicated numerals as described later. This point should be noted.

As for the standby state before the reset operation, it is similar to that in the case of the comparison example and accordingly omitted from the description.

Subsequently, at the access preparation step, as shown in FIG. 7, the bit line driver 2' applies 0.5 V to the selected bit line BL, and 1.5 V to unselected bit lines BL. In addition, the word line driver 3' applies 2.5 V to the selected word line WL, and 1.5 V to unselected word lines WL.

At the access step, after bringing unselected bit lines BL and unselected word lines WL into the floating state, the bit line driver 2' applies 0 V to the selected bit line BL as shown in FIG. 7, and the word line driver 3' applies 3.0 V to the selected word line WL (s2 in FIG. 7).

At the access step, the selected memory cell MC is applied with a reverse bias of the reset voltage Vreset, that is, 3.0 V.

When the potential on the selected bit line BL is changed from 0.5 V to 0 V (s2 in FIG. 5), on the other hand, the potentials on unselected bit lines BL fall via the parasitic capacity Cbb (s3 in FIG. 5). Specifically, the potentials on the unselected bit lines BL in the floating state fall from near 1.5 V to near 1.0 V by 0.5 V.

This is similar to the case of the word lines WL. When the potential on the selected word line WL is changed from 2.5 V to 3.0 V (s2 in FIG. 7), the capacitive coupling through the parasitic capacity Cww boosts the potentials on the unselected word lines WL (s3 in FIG. 7). Specifically, the potentials on the unselected word lines WL in the floating state rise from near 1.5 V to near 2.0 V by 0.5 V.

Every unselected memory cell MC, however, is only applied with a reverse bias lower than 3.0 V that cannot reach the reset voltage Vreset. Specifically, unselected memory cells MC connected between the selected bit line BL and unselected word lines WL and unselected memory cells MC connected between unselected bit lines BL and the selected word line WL are only applied with a reverse bias of 2.0 V and other unselected memory cells with 1.0 V. In a word, the reset operation according to the present embodiment is possible to ensure a disturb margin of 1.0 V at the minimum even if it is assumed that the capacitive coupling between lines has a coupling coefficient of 1 as the worst condition.

In the example of write operation shown in FIGS. 5-7, it is assumed that the capacitive coupling has a coupling coefficient of 1, and the potential variation on the selected line causes the same variation in the potentials on all unselected lines.

In practice, however, all capacitive couplings between the selected line and unselected lines do not have a coupling coefficient of 1 but have those distributed over a range of 0-1. In addition, the distribution tends to become smaller as the distance from the unselected line to the selected line becomes longer.

Therefore, at the time of set operation, when the selected memory cell MC is applied with a forward bias of the set voltage Vset, that is, 3.0 V at the access step, certain unselected bit lines BL may possibly exhibit such potentials that rise from near 0.5 V to near 2.0 V while other unselected bit lines BL may possibly exhibit such potentials that hardly vary from near 0.5 V. In a word, in practice, after the selected memory cell MC is applied with a forward bias of the set voltage Vset, the potentials on unselected bit lines BL distribute over a range of 0.5-2.0 V. This point should be noted.

In addition, similar to this case, also at the time of reset operation, after the selected memory cell MC is applied with a reverse bias of the reset voltage Vreset, the potentials on unselected bit lines BL distribute over a range of 1.0-1.5 V. This point should be noted.

In either case, the write operation according to the present embodiment described with reference to FIGS. 5-7 is possible to ensure a disturb margin of 1.0 V at the minimum.

Up to now, the write operation according to the present embodiment is described using specific numerals. In general, the potential on each line can be described as follows.

Figure 8:
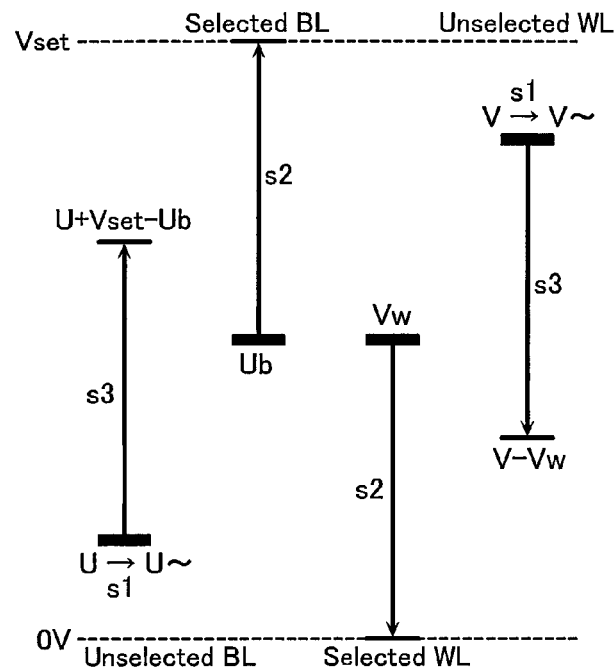
[FIG. 8] A diagram showing a general potential variation on each line at the time of write operation (set operation) through the floating access method in the semiconductor memory device according to the same embodiment.

FIG. 8 is a diagram showing a potential variation on each line at the time of set operation according to the present embodiment. The indications in the figure follow FIG. 6.

At the time of completion of the access preparation step, the potentials on the selected bit line, the unselected bit line, the selected word line and the unselected word line are represented by Ub(U1), U, Vw(V1) and V, respectively. In addition, the disturb margin intended to ensure is represented by Δ. In this case, the relations among those can be represented as in Expressions (1)-(5) in general.

$$V - U \leq V\text{reset} - \Delta \tag{1}$$

$$(U + V\text{set} - Ub) - (V - Vw) \leq V\text{set} - \Delta \tag{2}$$

$$Vw + \Delta < V \tag{3}$$

$$U + \Delta < Ub \tag{4}$$

$$U < Ub \leq Vw < V \tag{5}$$

Expressions (1) and (2) represent the potential relations between the unselected bit line and the unselected word line. Expression (3) represents the potential relation between the selected bit line and the unselected word line. Expression (4) represents the potential relation between the unselected bit line and the selected word line. Expression (5) indicates the condition for reverse biasing all memory cells at the access preparation step.

Ensuring the disturb margin Δ in the set operation requires setting the potential on each line at the access preparation step in such a manner that all memory cells are not forward-biased.

Therefore, the potential on each line is set so as to satisfy Vw−Ub>V−U from Expression (5).

If it is not possible to prepare many potentials for convenience of designing the bit line driver 2' and the word line driver 3', for example, it is sufficient to use Vw=Ub, and thus U+2Δ≤V, as in the specific example shown in FIGS. 5 and 6.

Figure 9:
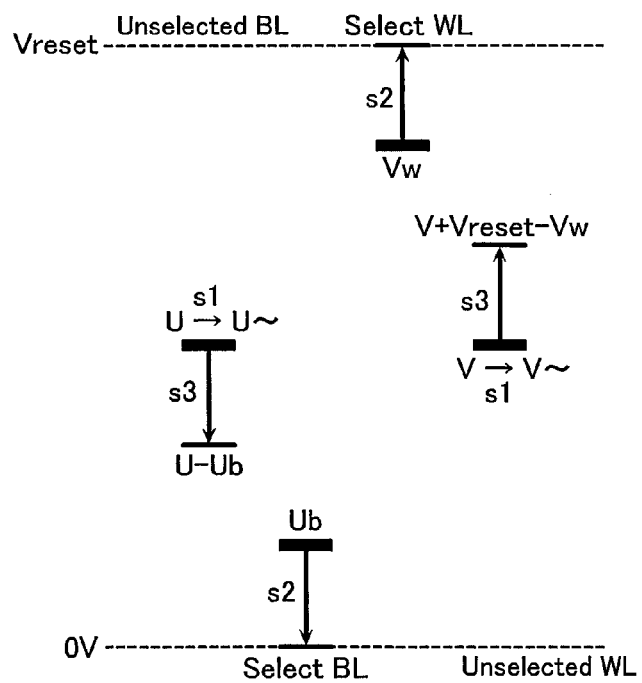
[FIG. 9] A diagram showing a general potential variation on each line at the time of write operation (reset operation) through the floating access method in the semiconductor memory device according to the same embodiment.

FIG. 9 is a diagram showing a potential variation on each line at the time of reset operation according to the present embodiment. The indications in the figure follow FIG. 7.

In the case of reset operation, at the time of completion of the access preparation step on each line, the relations among the potentials on the selected bit line, the unselected bit line, the selected word line and the unselected word line can be represented as in Expressions (6)-(10) in general.

$$V + \Delta \leq Vw \tag{6}$$

$$Ub + \Delta \leq U \tag{7}$$

$$Vw - Ub \leq V\text{reset} - \Delta \tag{8}$$

$$(V + V\text{reset} - Vw) - (U - Ub) \leq V\text{reset} - \Delta \tag{9}$$

$$Ub < U \leq V < Vw \tag{10}$$

Expression (6) represents the potential relation between the selected bit line and the unselected word line. Expression (7) represents the potential relation between the unselected bit line and the selected word line. Expression (8) represents the potential relation between the selected bit line and the selected word line. Expression (9) represents the potential relation between the unselected bit line and the unselected word line. Expression (10) indicates the condition for reverse biasing all memory cells at the access preparation step.

Ensuring the disturb margin Δ in the reset operation requires setting the potential on each line at the access preparation step in such a manner that all memory cells are not forward-biased, similar to that at the time of set operation.

In a word, the potential on each line is set so as to satisfy Vw−Ub>V−U from Expression (10).

If it is not possible to prepare many potentials for convenience of designing the bit line driver 2' and the word line driver 3', for example, it is sufficient to use V=U, and thus Ub+2Δ≤Vw, as in the specific example shown in FIG. 7.

Thus, the present embodiment is possible to realize lowered power consumption without any increase in chip area similar to the case of the comparison example. It is also possible to provide a semiconductor memory device capable of realizing highly reliable write operations.

[Second Embodiment]

The first embodiment describes the case of write operation to one memory cell MC. In contrast, a second embodiment describes the case of simultaneous write operation to plural memory cells MC.

Figure 10:
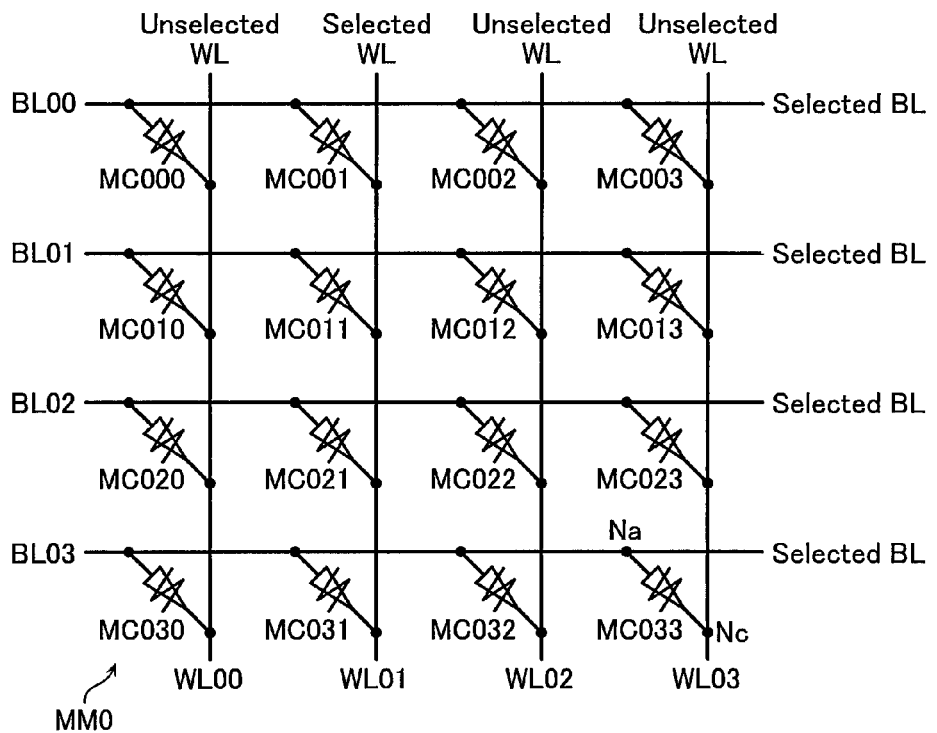
[FIG. 10] A diagram illustrative of an example of line selection at the time of write operation through a floating access method in a semiconductor memory device according to a second embodiment.

FIG. 10 is a diagram showing an example of line selection at the time of write operation through a floating access method according to the present embodiment.

When an excessive cell current flows in a memory cell MC, it varies the characteristic of the memory cell MC. Therefore, on write operation, a sense amp SA is required to monitor the cell current flowing in the memory cell MC.

With this regard, on simultaneous write operation to plural memory cells MC, one bit line BL00 may be determined as a selected bit line, for example. In this case, if plural memory cells MC000, MC001, . . . connected thereto are determined as selected memory cells, cell currents flowing in these selected memory cells MC000, MC001, . . . flow in the selected bit line BL00 in a superimposed manner. Accordingly, the sense amp SA cannot monitor the cell currents in the selected memory cells MC000, MC001, . . . individually.

Therefore, in the present embodiment, on simultaneous write operation to plural memory cells MC, one word line WL01 is determined as a selected word line, for example, as shown in FIG. 10, and plural memory cells MC000, MC011, MC021, MC031, . . . connected thereto are determined as selected memory cells.

Such the selection makes it possible to monitor cell currents in the memory cells MC at the corresponding sense amps SA and simultaneously write data in plural memory cells MC.

In addition, the present embodiment is possible to simultaneously write data in memory cells MC if they are commonly connected to one word line WL as described above. Therefore, in the case of the memory cell array 1 as shown in FIG. 2, when the word line WL01 is determined as a selected word line, for example, it is possible to simultaneously write data in memory cells MC in two memory cell mats MM0 and MM1 that share the word line WL01. Therefore, it is possible to process simultaneous write operation to plural memory cells faster.

Figure 11:
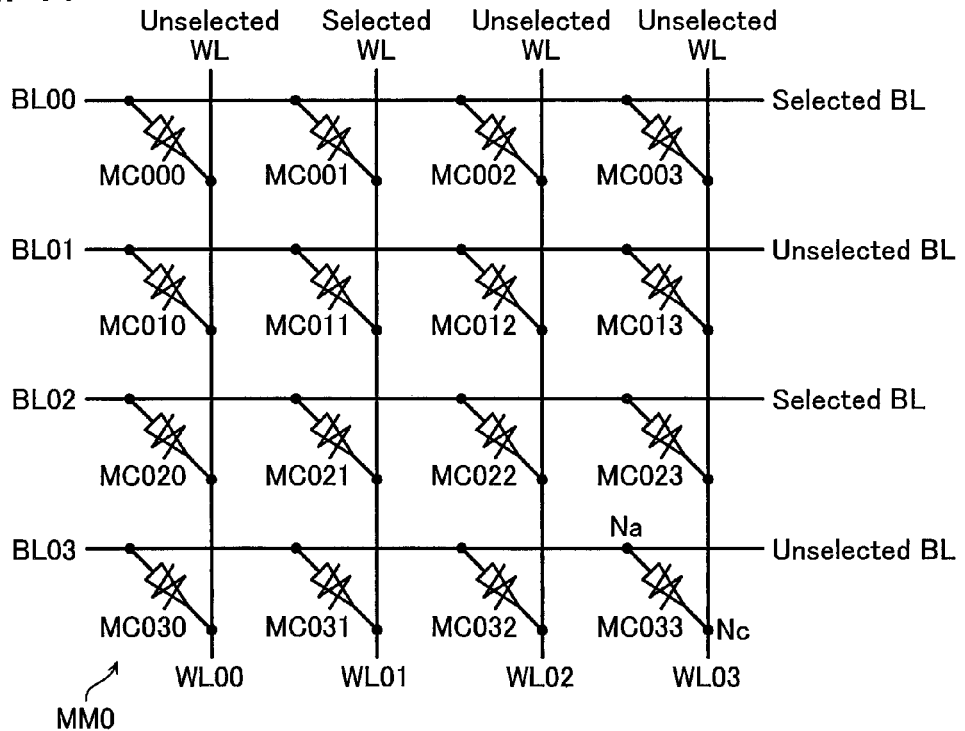
[FIG. 11] A diagram illustrative of another example of line selection at the time of write operation through the floating access method in the semiconductor memory device according to the same embodiment.

To the contrary, for example, as shown in FIG. 11, when the word line WL01 is determined as a selected word line, and the memory cells MC connected thereto are alternately determined as selected memory cells, it is possible to reduce the number of memory cells MC subject to simultaneous data write. In this case, the memory cells MC001, MC021, . . . become selected memory cells, and the bit lines BL00, BL02, . . . become selected bit lines.

Thus, the line selection method is effective if, for example, two adjacent bit lines BL, such as BL00 and BL01, share one sense amp SA. In addition, it can be used when desired to limit the number of memory cells subject to simultaneous data write with respect to the drive capability of the word line driver 3'.

As for the bias state of the memory cell array 1 and the potential variation on each line at the time of set operation and reset operation, they are similar to those in the first embodiment and accordingly omitted from the description.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor memory device, comprising:
a memory cell array including plural first lines, plural second lines intersecting said first lines, and plural memory cells provided at the intersections of said plural first lines and said plural second lines and operative to store data in accordance with different resistance states; and
a write circuit operative to execute a write operation to a data-write-targeted, selected memory cell of said plural memory cells, said memory cell having a set operation for changing said resistance state from the first resistance state to the second resistance state on application of a set voltage of the first polarity, and a reset operation for changing said resistance state from the second resistance state to the first resistance state on application of a reset voltage of the second polarity opposite in polarity to the first polarity, and having the voltage-current characteristic at said first polarity and the voltage-current characteristic at said second polarity being asymmetrical,
said write circuit, on execution of said write operation,
executing a first operation of applying a voltage across said first and second lines connected to said selected memory cell, and a different voltage across said first and second lines connected to another memory cell, and
after execution of said first operation, executing a second operation of applying a voltage, required for data write, across said first and second lines connected to said selected memory cell, and bringing at least one of said first and second lines connected to the other memory cell into the floating state, and
potentials on said first and second lines connected to said selected memory cell and potentials on said first and second lines connected to the other memory cell in said first operation being different from potentials on said first and second lines connected to said selected memory cell in said second operation.

2. The semiconductor memory device according to claim 1, wherein
the potentials on said first and second lines connected to said selected memory cell are denoted with $U1$ and $V1$, respectively, and the potentials on said first and second lines connected to the other memory cell are denoted with $U$ and $V$, respectively, and
said write circuit, on said write operation for subjecting said memory cell to set operation, executes said first operation on condition that $V-U>V1-U1$.

3. The semiconductor memory device according to claim 2, wherein
said write circuit, on said write operation for subjecting said memory cell to set operation, executes said first operation on condition that $U1=V1$ and $U<V$.

4. The semiconductor memory device according to claim 1, wherein
the potentials on said first and second lines connected to said selected memory cell are denoted with $U1$ and $V1$, respectively, and the potentials on said first and second lines connected to the other memory cell are denoted with U and V, respectively, and said write circuit, on said write operation for subjecting said memory cell to reset operation, executes said first operation on condition that V1=U1>V−U.

5. The semiconductor memory device according to claim 4, wherein said write circuit, on said write operation for subjecting said memory cell to reset operation, executes said first operation on condition that V=U and U1<V1.

6. The semiconductor memory device according to claim 1, wherein said write circuit determines plural memory cells connected to one second line of said plural second lines as selected memory cells, and executes simultaneous write operation to said plural selected memory cells.

7. The semiconductor memory device according to claim 6, wherein said write circuit executes simultaneous write operation to said plural selected memory cells, said plural selected memory cells being not adjacent to each other.

8. A semiconductor memory device, comprising:

a memory cell array including plural first lines, plural second lines intersecting said first lines, and plural memory cells provided at the intersections of said plural first lines and said plural second lines and operative to store data in accordance with different resistance states; and a write circuit operative to execute a write operation to a data-write-targeted, selected memory cell of said plural memory cells, said memory cell having a set operation for changing said resistance state from the first resistance state to the second resistance state on application of a set voltage of the first polarity, and a reset operation for changing said resistance state from the second resistance state to the first resistance state on application of a reset voltage of the second polarity opposite in polarity to the first polarity, said write circuit, on execution of said write operation, executing a first operation of applying a voltage across said first and second lines connected to said selected memory cell, and a different voltage across said first and second lines connected to another memory cell, and after execution of said first operation, executing a second operation of applying a voltage, required for data write, across said first and second lines connected to said selected memory cell, and bringing at least one of said first and second lines connected to the other memory cell into the floating state, and potentials on said first and second lines connected to said selected memory cell and potentials on said first and second lines connected to the other memory cell in said first operation being different from potentials on said first and second lines connected to said selected memory cell in said second operation.

9. The semiconductor memory device according to claim 8, wherein the potentials on said first and second lines connected to said selected memory cell are denoted with U1 and V1, respectively, and the potentials on said first and second lines connected to the other memory cell are denoted with U and V, respectively, and said write circuit, on said write operation for subjecting said memory cell to set operation, executes said first step on condition that V−U>V1−U1.

10. The semiconductor memory device according to claim 9, wherein said write circuit, on said write operation for subjecting said memory cell to set operation, executes said first operation on condition that U1=V1 and U<V.

11. The semiconductor memory device according to claim 8, wherein the potentials on said first and second lines connected to said selected memory cell are denoted with U1 and V1, respectively, and the potentials on said first and second lines connected to the other memory cell are denoted with U and V, respectively, and said write circuit, on said write operation for subjecting said memory cell to reset operation, executes said first operation on condition that V1−U1>V−U.

12. The semiconductor memory device according to claim 11, wherein said write circuit, on said write operation for subjecting said memory cell to reset operation, executes said first operation on condition that V=U and U1<V1.

13. The semiconductor memory device according to claim 8, wherein said write circuit determines plural memory cells connected to one second line of said plural second lines as selected memory cells, and executes simultaneous write operation to said plural selected memory cells.

14. The semiconductor memory device according to claim 13, wherein said write circuit executes simultaneous write operation to said plural selected memory cells, said plural selected memory cells being not adjacent to each other.

15. A semiconductor memory device, comprising:

a memory cell array including plural memory cell mats stacked, each memory cell mat containing plural first lines, plural second lines intersecting said first lines, and plural memory cells provided at the intersections of said plural first lines and said plural second lines and operative to store data in accordance with different resistance states; and a write circuit operative to execute a write operation to a data-write-targeted, selected memory cell of said plural memory cells, a certain memory cell mat sharing said first line or second line with another memory cell mat located adjacent to said certain memory cell mat in the direction of stacking, said memory cell having a set operation for changing said resistance state from the first resistance state to the second resistance state on application of a set voltage of the first polarity, and a reset operation for changing said resistance state from the second resistance state to the first resistance state on application of a reset voltage of the second polarity opposite in polarity to the first polarity, and having the voltage-current characteristic at said first polarity and the voltage-current characteristic at said second polarity being asymmetrical, said write circuit, on execution of said write operation, executing a first operation of applying a certain voltage across said first and second lines connected to said selected memory cell, and applying a higher voltage than said certain voltage across said first and second lines connected to another memory cell and after execution of said first operation, executing a second operation of applying a voltage, required for data write, across said first and second lines connected to said selected memory cell, and bringing at least one of said first and second lines connected to the another memory cell into the floating state, and potentials on said first and second lines connected to said selected memory cell and potentials on said first and second lines connected to the other memory cell in said first operation being different from potentials on said first and second lines connected to said selected memory cell in said second operation.

16. The semiconductor memory device according to claim 15, wherein the potentials on said first and second lines connected to said selected memory cell are denoted with U1 and V1, respectively, and the potentials on said first and second lines connected to said unselected memory cell are denoted with U and V, respectively, and said write circuit, on said write operation for subjecting said memory cell to set operation, executes said first operation on condition that V−U>V1−U1.

17. The semiconductor memory device according to claim 16, wherein said write circuit, on said write operation for subjecting said memory cell to set operation, executes said first operation on condition that U1=V1 and U<V.

18. The semiconductor memory device according to claim 15, wherein the potentials on said first and second lines connected to said selected memory cell are denoted with U1 and V1, respectively, and the potentials on said first and second lines connected to the another memory cell are denoted with U and V, respectively, and said write circuit, on said write operation for subjecting said memory cell to reset operation, executes said first operation on condition that V1−U1>V−U.

19. The semiconductor memory device according to claim 15, wherein said write circuit, on said write operation for subjecting said memory cell to reset operation, executes said first operation on condition that V=U and U1<V1.

20. The semiconductor memory device according to claim 15, wherein a certain memory cell mat sharing a certain second line with another memory cell mat located adjacent to said certain memory cell mat in the direction of stacking, and said write circuit determines plural memory cells connected to said certain second line as selected memory cells, and executes simultaneous write operation to said plural selected memory cells.

* * * * *